(12) United States Patent
Stilgenbauer

(10) Patent No.: US 12,003,247 B2
(45) Date of Patent: Jun. 4, 2024

(54) NOISE SHAPER VARIABLE QUANTIZER

(71) Applicant: STMicroelectronics S.r.l., Agrate Brianza (IT)

(72) Inventor: Francesco Stilgenbauer, Rho (IT)

(73) Assignee: STMicroelectron S.r.l., Agrate Brianza (IT)

( * ) Notice: Subject to any disclaimer, the term of this patent is extended or adjusted under 35 U.S.C. 154(b) by 125 days.

(21) Appl. No.: 17/846,520

(22) Filed: Jun. 22, 2022

(65) Prior Publication Data

US 2023/0421167 A1 Dec. 28, 2023

(51) Int. Cl.
  *H03M 1/06* (2006.01)
  *H03M 3/00* (2006.01)

(52) U.S. Cl.
  CPC ....... *H03M 1/0668* (2013.01); *H03M 1/0626* (2013.01); *H03M 1/0648* (2013.01); *H03M 3/492* (2013.01); *H03M 3/51* (2013.01)

(58) Field of Classification Search
  CPC ............. H03M 1/0668; H03M 1/0626; H03M 1/0648; H03M 3/492; H03M 3/51
  USPC ........................................ 341/131, 139, 143
  See application file for complete search history.

(56) References Cited

U.S. PATENT DOCUMENTS

| 5,252,973 | A | 10/1993 | Masuda |
| 6,462,685 | B1 * | 10/2002 | Korkala ............... H03M 3/3287 341/131 |
| 7,183,954 | B1 | 2/2007 | Melanson et al. |
| 7,239,258 | B2 | 7/2007 | Grosso et al. |
| 7,671,774 | B2 * | 3/2010 | Braswell ............... H03M 3/366 341/143 |
| 8,890,727 | B1 * | 11/2014 | da Silva ............... H03M 1/185 341/118 |
| 2011/0169672 | A1 | 7/2011 | Deval et al. |
| 2014/0354336 | A1 | 12/2014 | Syllaios et al. |
| 2015/0042496 | A1 | 2/2015 | Straeussnigg et al. |

FOREIGN PATENT DOCUMENTS

EP  3001569 A1  3/2016
WO  2016118674 A1  7/2016

OTHER PUBLICATIONS

EPO Search Report and Written Opinion for counterpart EP Appl. No. 23175324.5, report dated Nov. 27, 2023, 9 pgs.
Vera, Pablo, et al: "DAC Mismatch Shaping in Discrete Time Sigma Delta ADCs with Non-Uniform Quantizer," Auckland University of Technology, Dec. 20, 2020, 6 pgs.

* cited by examiner

*Primary Examiner* — Khai M Nguyen
(74) *Attorney, Agent, or Firm* — Crowe & Dunlevy LLC

(57) ABSTRACT

A signal processing circuit includes a filter generating a quantizer input signal from a noise shaping input signal and a quantizer output signal. A quantizer divides the quantizer input signal by a scaling factor to produce a noise shaping output signal and multiplies the noise shaping output signal by the scaling factor to produce the quantizer output signal. Receiver circuitry scales the quantizer output signal by a second scaling factor. A dynamic range optimization circuit compares a current value of the noise shaping input signal to a threshold value, lowers or raises the scaling factor in response to the comparison, and proportionally lowers or raises the scaling factor such that a ratio between the scaling factor and second scaling factor remains substantially constant.

20 Claims, 13 Drawing Sheets

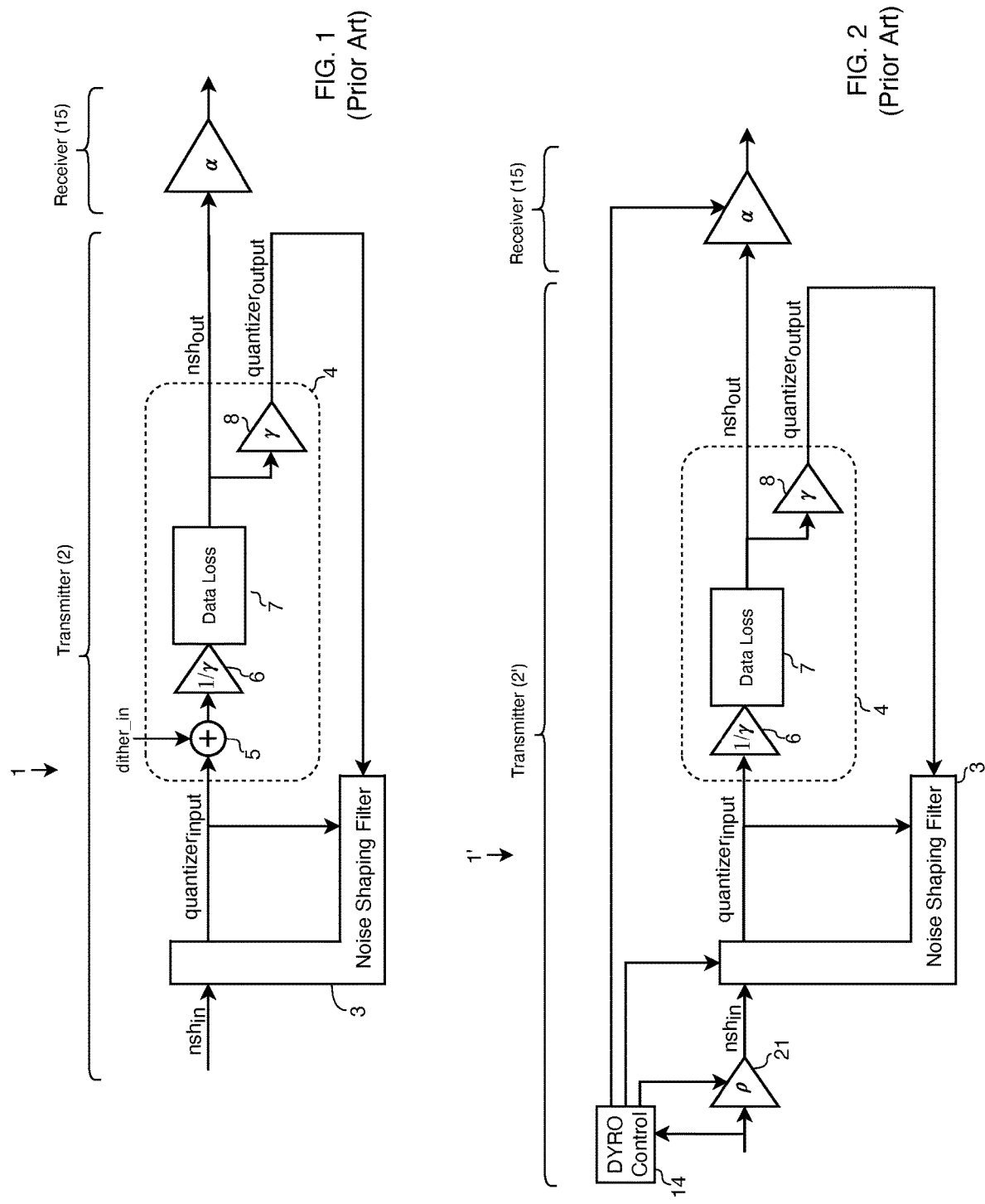

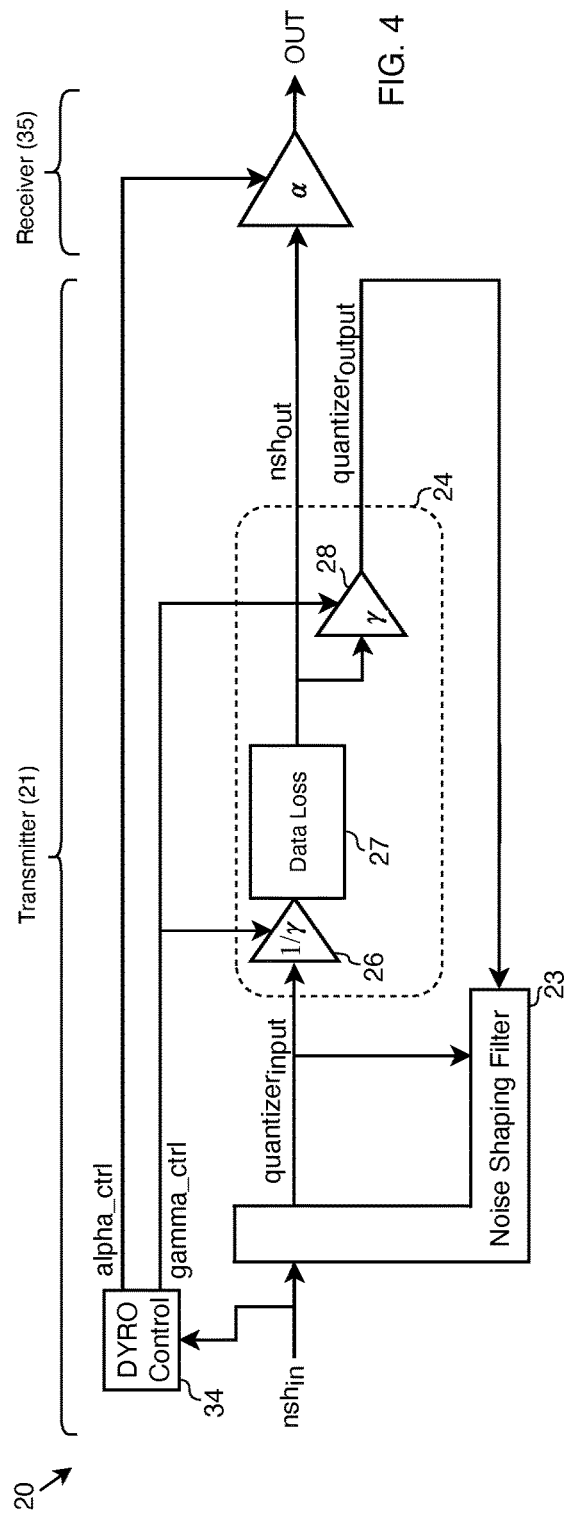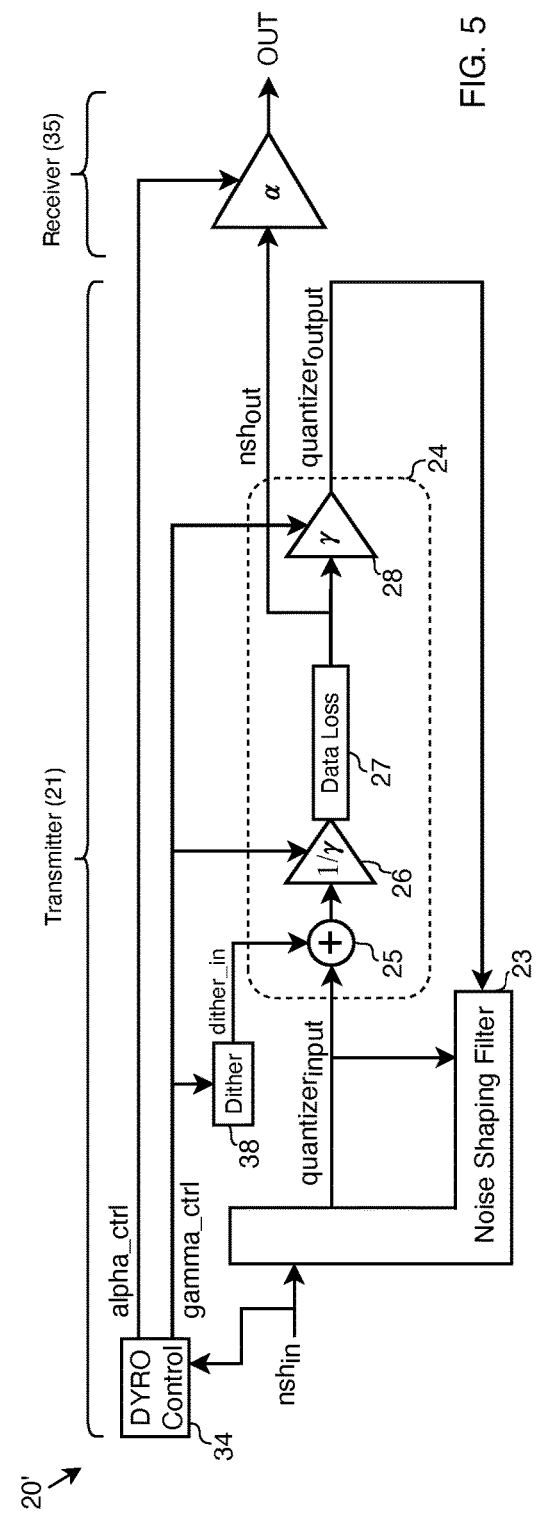

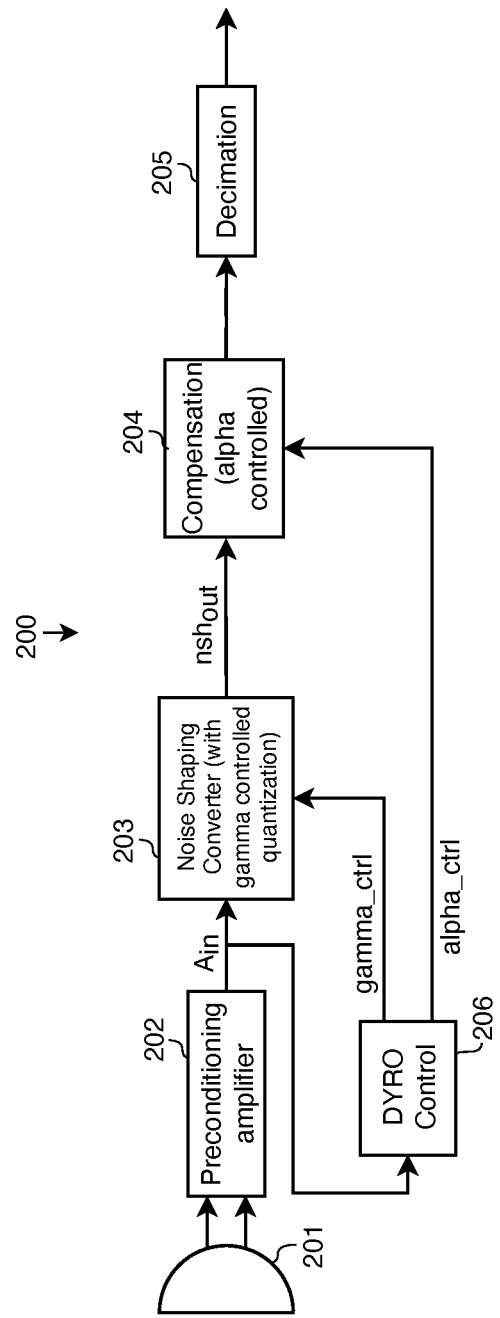

NOISE SHAPER VARIABLE QUANTIZER

TECHNICAL FIELD

This disclosure is related to the field of signal processing, and, more particularly, to a signal processing circuit utilizing variable scaling during re-quantization to reduce quantization noise and increase dynamic range without causing a transient audible phenomena referred to in the art as a "pop".

BACKGROUND

The following background is provided with specific examples to show issues related to quantization, with it being understood that this disclosure itself is in no way limited to the types and contexts of the examples provided in this background.

A first prior art signal processing chain 1 is now described with reference to FIG. 1. The signal processing chain 1 includes a transmitter section (e.g., a noise shaping quantizer) 2 and a receiver section 15 (e.g., a digital to analog converter, DAC).

The noise shaping quantizer 2 includes a noise shaping filter 3 that receives a noise shaping input signal $nsh_{in}$. The noise shaping filter 3 performs filtering and utilizes error feedback to produce a quantizer input signal $quantizer_{input}$. A quantizer 4 receives the quantizer input signal $quantizer_{input}$ and performs re-quantization to produce a noise shaping output signal $nsh_{out}$. The receiver 15 may apply a single fixed factor $\alpha$ to the noise shaping output signal $nsh_{out}$.

The quantizer 4 includes a summer 5 through which a dither signal dither_in is injected to the quantizer input signal $quantizer_{input}$ prior to division by a fixed factor $\gamma$ in a divider 6. A truncation circuit 7 operates on the output of the divider 6, resulting in data loss, for example by rounding, saturation, or introducing of other non-linearities, producing the noise shaping output signal $nsh_{out}$. A feedback multiplier 8 multiplies the noise shaping output signal $nsh_{out}$ by the same fixed factor $\gamma$ to produce a quantizer output signal $quantizer_{output}$ provided to the noise shaping filter 3. The fixed factor $\gamma$ is set to a minimum sufficient value for expected values of the noise shaping input signal $nsh_{in}$. This means, however, that at certain values of the noise shaping input signal $nsh_{in}$, the factor $\gamma$ is higher than strictly necessary, with the result being that dynamic range is lower than it could be.

Attempts at correcting this issue have been made. Refer now to FIG. 2, showing a second prior art signal processing chain 1' (full details of which may be found in U.S. Pat. No. 7,239,258, incorporated by reference in its entirety). The quantization noise in the audio signal within the audio playback circuit 1' is the residual low power and high frequency signal resulting from re-quantization which occurs in the noise shaping circuit 4. When the audio signal is lower than a given threshold, it is possible to scale the noise shaping input signal $nsh_{in}$ by an adjustable factor $\rho$ prior to noise shaping by the noise shaper 4, while maintaining the quantization performed at a fixed scaling factor $1/\gamma$, to lower the quantization noise and increase dynamic range. This scaling is performed by a multiplication circuit 21 that scales an input audio signal by the adjustable factor $\rho$ to produce the noise shaping input signal $nsh_{in}$. A dynamic range optimization (DYRO) control circuit 14 controls the adjustable factor $\rho$ on the fly in an attempt to maximize the dynamic range and compensates the receiver 15 accordingly by an adjustable factor $\alpha$ (e.g., an adjustable scaling factor).

However, the multiplication which results from the error feedback arrangement within the noise shaper 4' causes the injection of a transient disturbance in the feedback, and this transient disturbance is propagated through to the output signal where it manifests as a transient audible phenomena referred to in the art as a "pop".

This can be observed in the graphs of the operation of the audio playback circuit 1 shown in FIG. 3, where transient disturbance in the output from the noise shaping circuit 4 (labelled as o_nsh), transient disturbance in the signal in the noise shaping circuit 4 after re-quantization but prior to filtering (labelled as o_prefilt), and transient disturbance in the output of a filter within the noise shaping circuit 4 (labelled as o_filt), as shown for example by the output of an ITU filter labelled as itu), can be observed. As can be appreciated, this pop is undesirable, as the pop may be audible by the human ear.

As such, further development is needed.

SUMMARY

Disclosed herein is a signal processing circuit including a transmitter section. The transmitter section includes a noise shaper receiving a noise shaping input signal and a quantizer output signal, the noise shaper configured to generate a quantizer input signal based upon the noise shaping input signal and the quantizer output signal, and a quantizer receiving the quantizer input signal and configured to divide the quantizer input signal by a scaling factor to produce a noise shaping output signal and to multiply the noise shaping output signal by the scaling factor to product the quantizer output signal.

The signal processing circuit also includes a receiver section, the receiver section including receiver circuitry receiving the noise shaping output signal, the receiver circuitry configured to scale the quantizer output signal by a second scaling factor, and a dynamic range optimization circuit. The dynamic range optimization circuit is configured to determine whether an absolute value of the noise shaping input signal is less than a threshold value, lower the scaling factor in response to the absolute value of the noise shaping input signal being less than the threshold value, and decrease the second scaling factor in response to the absolute value of the noise shaping input signal being less than the threshold value, proportionally to the lowering of the scaling factor such that a ratio between the scaling factor and the second scaling factor remains substantially constant.

The dynamic range optimization circuit is further configured to increase the scaling factor in response to the absolute value of the noise shaping input signal being greater than the threshold value and increase the second scaling factor in response to the absolute value of the noise shaping input signal being greater than the threshold value, proportionally to the increase in the scaling factor such that the ratio between the scaling factor and second scaling factor remains substantially constant.

A dither generator may be configured to generate a dither signal having a range defined by the scaling factor, and the transmitter section may include a summing circuit configured to inject the dither signal into the quantizer input signal prior to quantization thereof by the quantizer.

The quantizer may apply a truncation to the quantizer input signal after division thereof by the scaling factor.

The scaling factor may be a power of two.

The quantizer input signal and quantizer output signal may be digital, and the quantizer may be implemented digitally.

The quantizer input signal and quantizer output signal may be analog, and the quantizer may be implemented in an analog fashion, with the quantizer including an analog to digital converter (ADC) receiving the quantizer input signal and digitizing the quantizer input signal to produce the noise shaping output signal such that it is scaled by the scaling factor, and a digital to analog converter (DAC) receiving the noise shaping output signal and converting the noise shaping output signal to produce the quantizer output signal such that it is multiplied by the scaling factor.

The receiver section may be implemented digitally.

The receiver section may be implemented in an analog fashion.

The noise shaper may include an input summer configured to subtract an error signal from the noise shaping input signal to produce the quantizer input signal, an error summer configured to subtract the quantizer input signal from the quantizer output signal to produce an intermediate output, and a noise shaping filter configured to apply a noise shaping filter function to the intermediate output to produce the error signal.

The noise shaper may include a sigma delta modulator receiving the noise shaping input signal and the quantizer output signal as output and applying a two-input one-output filtering thereto to produce the quantizer input signal. The two-input one-output filtering may have a transfer function of:

$$Y(z)=L_1(z)U(z)-L_1(z)V(z),$$

with the noise shaping input signal being $U(z)$ and the quantizer output signal being $V(z)$.

The absolute value of the noise shaping signal may be determined from a current value of the noise shaping input signal.

Also disclosed herein is a signal processing method including generating a quantizer input signal based upon a noise shaping input signal and a quantizer output signal, dividing the quantizer input signal by a scaling factor to produce a noise shaping output signal, and multiplying the noise shaping output signal by the scaling factor to product the quantizer output signal. The method further includes scaling the quantizer output signal by a second scaling factor, determining whether an absolute value of the noise shaping input signal is less than a threshold value, lowering the scaling factor in response to the absolute value of the noise shaping input signal being less than the threshold value, and decreasing the second scaling factor in response to the absolute value of the noise shaping input signal being less than the threshold value, proportionally to the lowering of the scaling factor such that a ratio between the scaling factor and the second scaling factor remains substantially constant.

The method may further include generating an analog output signal from at least the noise shaping output signal by selectively connecting or disconnecting current sources and current sinks to differential outputs in response to the noise shaping output signal (the current sources and current sinks being scaled by the second scaling factor), amplifying the analog output signal, and driving a speaker with the analog output signal. Adjustment of the scaling factor and the second scaling factor proportionally to one another may serve to prevent transients resulting from scaling factor adjustment from being present in the noise shaping output signal and therefore from causing audible pops to be played by the speaker.

The method may include increasing the scaling factor in response to the absolute value of the noise shaping input signal being greater than the threshold value and increasing the second scaling factor in response to the absolute value of the noise shaping input signal being greater than the threshold value, proportionally to the increase in the scaling factor such that the ratio between the scaling factor and second scaling factor remains substantially constant.

The method may include generating a dither signal having a range defined by the scaling factor and injecting the dither signal into the quantizer input signal prior to quantization thereof.

The method may include applying a truncation to the quantizer input signal after division thereof by the scaling factor.

The scaling factor may be a power of two.

BRIEF DESCRIPTION OF THE DRAWINGS

FIG. 1 is a block diagram of a first known noise shaping quantizer.

FIG. 2 is a block diagram of a second known noise shaping quantizer.

FIG. 4 is a block diagram of a first noise shaping variable quantizer broadly described herein.

FIG. 5 is a block diagram of a first noise shaping variable quantizer broadly described herein, with dither that is scaled together with quantization.

FIG. 24 is a block diagram of an analog to digital audio conversion circuit described herein.

DETAILED DESCRIPTION

Figure 3:
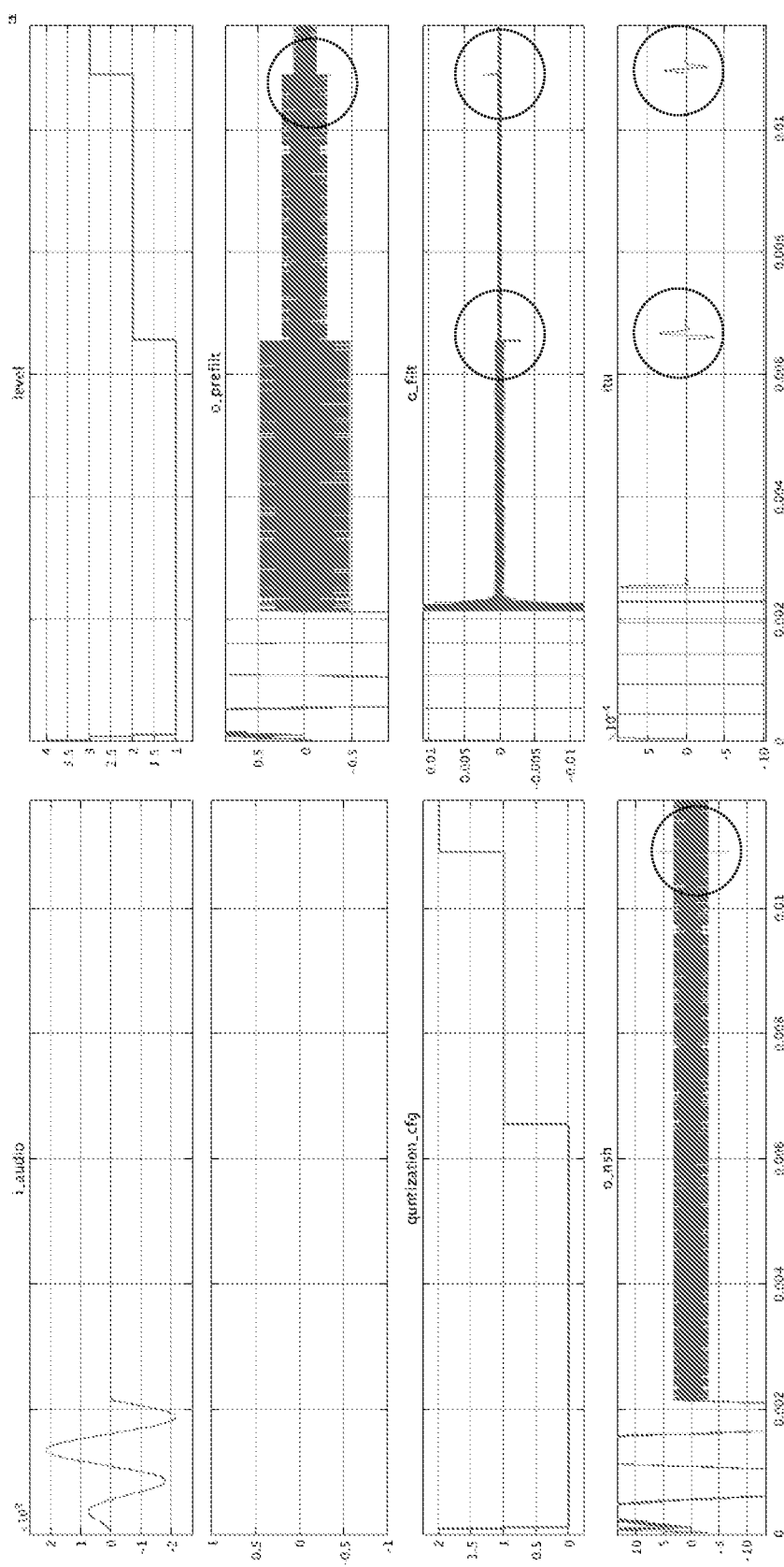
FIG. 3 includes a series of graphs showing values of signals in an audio playback circuit utilizing the known noise shaping quantizer of FIG. 2 while performing audio signal scaling at the noise shaper input, compensating it into the receiver and into the noise shaper filter memory, with the occurrence of pop due to the audio signal scaling being visible.

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

A. Broad Concept and Associated Embodiment

Now described herein with initial reference to FIG. 4 is a sample signal processing chain 20 including a transmitter section (e.g., a noise shaping quantizer) 21 and a receiver section 35 (e.g., a digital to analog converter, DAC). The transmitter section 21 may be analog or digital, and the receiver section 35 may be analog or digital.

Described now is a generic case, applicable to both analog and digital implementations. The noise shaping quantizer 21 includes a noise shaping filter 23 that receives a noise shaping input signal $nsh_{in}$. The noise shaping filter 23 performs filtering and utilizes error feedback to produce a quantizer input signal $quantizer_{input}$. A quantizer 24 receives the quantizer input signal $quantizer_{input}$ and, under control of a dynamic range optimization circuit (DYRO control circuit) 34 as will be explained below, performs noise shaping and on-the-fly scaling on the noise shaping input signal $nsh_{in}$ to produce a noise shaped output signal $nsh_{out}$.

The quantizer input signal $quantizer_{input}$ is divided by an adjustable factor $\gamma$ (e.g., a scaling factor) in a divider 26. A truncation circuit 27 operates on the output of the divider 26, resulting in data loss, for example by rounding, saturation, or introducing of other non-linearities, producing the noise shaping output signal $nsh_{out}$. A feedback multiplier 28 multiplies the noise shaping output signal $nsh_{out}$ by the same adjustable factor $\gamma$ to produce a quantizer output signal $quantizer_{output}$ provided to the noise shaping filter 23 for use in performing noise shaping. The receiver section 35 multiplies the noise shaping output signal $nsh_{out}$ by another adjustable factor $\alpha$ (e.g., a scaling factor) to produce an output signal OUT. The adjustable factor $\gamma$ and adjustable factor $\alpha$ may also be referred to as scaling factors herein. The different potential valuables of the adjustable factors $\gamma$ and $\alpha$ may be represented by an index k, for example, $\gamma_k$ and $\alpha_k$.

The DYRO control circuit 34 monitors the noise shaping input signal $nsh_{in}$ and based upon the amplitude thereof, adjusts the adjustable factor $\gamma$ and the adjustable factor $\alpha$ on the fly so as to balance output signal OUT swing with its quantization noise, as will be described below, with such adjusting maintaining the ratio $\alpha/\gamma$ as being a fixed constant.

There are physical limits to the divider 26 and the feedback multiplier 28, as well as to the receiver section 35, that limits the output signal OUT swing. To work within these constraints, the DYRO control circuit 34 compares the noise shaping input signal $nsh_{in}$ to a series of accurately defined thresholds, and sets the adjustable factor $\gamma$ and the adjustable factor $\alpha$ on the fly based upon those comparisons.

In detail, $\gamma$ and $\alpha$ may each take one of i different values. As a first order approximation, the following relationship is present:

$$\frac{nsh_{in}}{\gamma_i} \cong nsh_{out}.$$

For a given maximum value of the absolute value of the noise shaping output signal $nsh_{out}$, denoted as $nsh_{out_{max}}$ (which is set by limits inherent to the implementation of the quantizer 24), the following relationship is therefore present:

$$nsh_{in_{max}}(i) \cong nsh_{out_{max}} \cdot \gamma_i.$$

$nsh_{in_{max}}(i)$ is therefore the maximum of the absolute value of the noise shaping input signal $nsh_{in}$ at the value of $\gamma_i$.

Assume, as an example, that $i=1, \ldots, 3$. Therefore, $\gamma_i=[\gamma_1; \gamma_2; \gamma_3]$, with $\gamma_1 > \gamma_2 > \gamma_3$, and $\alpha_i=[\alpha_1; \alpha_2; \alpha_3]$, with $\alpha_1 > \alpha_2 > \alpha_3$, and with those values being such that $\alpha/\gamma$ remains a fixed constant. Given the example value of $i=1, \ldots, 3$ the thresholds are therefore $TH_i=[TH_1, TH_2, \text{and } TH_3]$, with $TH_1 > TH_2 > TH_3$. In general, the greater the adjustable factors $\gamma$ and $\alpha$, the greater the output signal OUT swing but also the greater the quantization noise. Conversely, the lesser the adjustable factors $\gamma$ and $\alpha$, the lesser the output signal OUT swing and the lesser the quantization noise.

During operation, the DYRO control circuit 34 compares the current value (e.g., a current value) of the noise shaping input signal $nsh_{in}$ to the thresholds $TH_1$, $TH_2$, and $TH_3$. If the noise shaping input signal $nsh_{in}$ is greater than $TH_1$, then the adjustable factors are set by the DYRO control circuit 34 as follows:

$$\gamma=\gamma_1 \text{ and } \alpha=\alpha_1.$$

If the noise shaping input signal $nsh_{in}$ is greater than $TH_2$ but less than $TH_1$, then the adjustable factors are set by the DYRO control circuit 34 as follows:

$$\gamma=\gamma_2 \text{ and } \alpha=\alpha_2.$$

If the noise shaping input signal $nsh_{in}$ is greater than $TH_3$ but less than $TH_2$, then the adjustable factors are set by the DYRO control circuit 34 as follows:

$$\gamma=\gamma_3 \text{ and } \alpha=\alpha_3.$$

If i were to be greater than 3, then additional thresholds and adjustable factors would be present, and further comparisons consistent with the above described comparisons would be performed.

The result of this above-described operation is that the quantizer output quantizer$_{output}$ will practically have the same amplitude as the quantizer quantizer$_{input}$ while the quantization noise will be reduced.

These comparison and adjustable factor setting operations are performed continuously or periodically on the noise shaping input signal nsh$_{in}$, and therefore the adjustment of the adjustable factors γ and α is performed continuously or periodically. The result of this is that the output signal OUT will practically have the same amplitude while quantization noise present at the receiver section 35 OUT will be reduced—thus, dynamic range at OUT is increased.

In some implementation instances, the DYRO control circuit 34 may implement a margin in its thresholds and therefore in its threshold comparisons. The margin value is greater than zero but less than one. The thresholds can be calculated as:

$$th(i) = nsh_{in_{max}}(i) \cdot nsh_{out_{max}} \cdot \gamma_i \cdot margin(i).$$

Time filtering may be performed on the threshold comparisons by the DYRO control circuit 34 in the falling direction. In the falling direction (such as when the noise shaping input signal nsh$_{in}$ was previously greater than TH$_1$, but is now less than TH$_1$ and greater than TH$_2$) for example, the DYRO control circuit 34 may wait to take action to change the adjustable factor γ and the adjustable factor α until after the noise shaping input signal nsh$_{in}$ has fallen below and remained below the threshold in question (e.g., has fallen below TH$_1$) for a given period of time. Such time filtering may optionally be performed in the rising direction (such as when the noise shaping input signal nsh$_{in}$ was previously less than TH$_1$ and greater than TH$_2$, but is now greater than TH$_1$) as well, although this may not be desired in some situations.

Further details of the principles of operation of the DYRO control circuit 34 may be found in U.S. Pat. No. 7,239,258, incorporated by reference above.

B. Dither

Optionally, as shown in the embodiment of FIG. 5, the dither signal dither_in is generated by a dither circuit 38 under control of the DYRO control circuit 34 according to changes made to the adjustable factor γ. Dithering prevents correlation between the quantization noise and the desired information represented by the output signal OUT.

Figure 6:
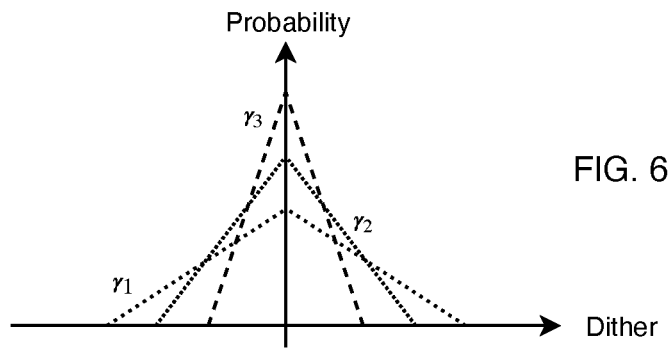
FIG. 6 is a graph showing how the probability distribution of the dither injected into the signal in the noise shaping variable quantizer of FIG. 5 changes during operation with the scaling of the quantization.

In instances where the quantizer 24 is digital, the injected dither may have a triangular probability distribution function as shown in FIG. 6, with the specific shape of the probability distribution function changing with γ. Details of this type of dithering may be found in Digital Dither, S. P. Lipshitz and, J. Vanderkooy, In Audio Engineering Society Convention 81, November 1986, the contents of which are incorporated by reference in their entirety.

The injected dither may instead have a rectangular probability function, also in instances where the quantizer 24 is digital. In instances where the quantizer 24 is analog, the dither circuit 38, under control of the DYRO control circuit 34, may supply the dither signal dither_in as two random analog values.

Figure 7:
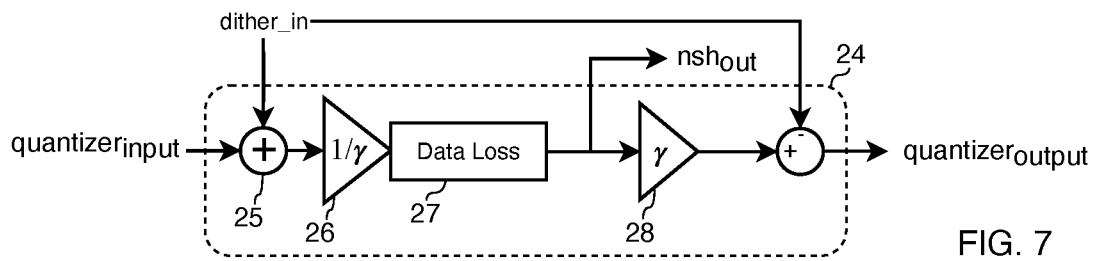
FIG. 7 is a block diagram showing an embodiment of the quantizer of FIG. 5 in which the dither is subtracted prior to production of the quantizer output.

In the example generic quantizer 24 described above, the dither signal dither_in is injected to the quantizer input quantizer$_{input}$ prior to operation thereon by the divider 26, but is not subtracted from the quantizer output quantizer$_{output}$. However, as shown in the example of FIG. 7, the quantizer 24 may include a subtractor 24 that subtracts the dither signal dither_in from the quantizer output quantizer$_{output}$.

The dither signal dither_in in embodiments in which the quantizer 24 is digital, the dither signal may be generated through the sum of two linear feedback shift registers (LFSRs), or as the sum of two separated branches of a single LFSR. The dither signal may be generated through any suitable circuit, and may take any suitable form.

Figure 8:
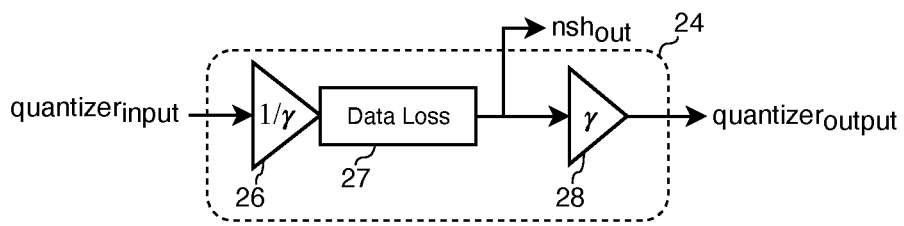
FIG. 8 is a block diagram showing an embodiment of the quantizer of FIG. 4 in which dither is not injected.

In the above example generic quantizer 24, dither is injected. However, as shown in FIG. 8, the quantizer 24 may not include dither injection, and the quantizer input quantizer$_{input}$ may be directly fed to the divider 26.

C. Quantizer Types

In the above example, the transmitter section 21 is described generically, and such description of operation applies to either an analog or a digital transmitter section. Also in the above example, the receiver section 35 is described generically, and such description of operation applies to either an analog or digital receiver section 35. With this being said, specific examples will be provided below, in which:

1. The transmitter section 21 is digital and the receiver section 35 is analog;
2. The transmitter section 21 is digital and the receiver section 35 is digital;
3. The transmitter section 21 is analog and the receiver section 35 is digital; and
4. The transmitter section 21 is analog and the receiver section 35 is analog.

Each of these will be described, but first, digital and analog quantizers for use therein will be described. Note that any digital functions or components described herein may be incorporated within a microprocessor, digital signal processor, or programmable logic device, and any analog functions or components described herein may be incorporated within discrete analog components.

Figure 9:
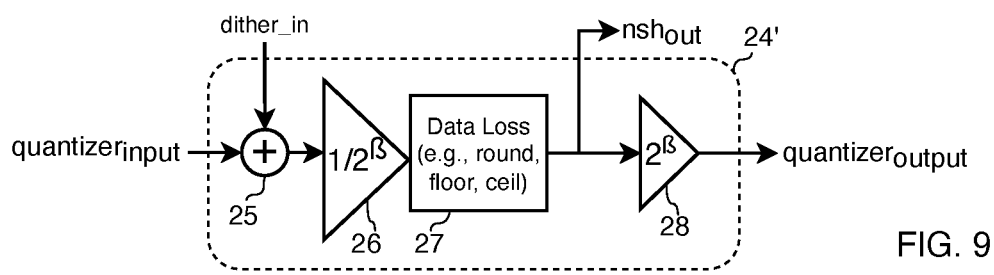
FIG. 9 is a block diagram showing an embodiment of the quantizer of FIG. 5 in which the quantizer is digital.

A sample digital quantizer 24' is shown in FIG. 9 and has the structure and function of the digital quantizer 24 described above. In this sample digital quantizer 24', the adjustable factor γ is equal to $2^\beta$, and therefore the divider 26 performs a division of the quantizer input quantizer$_{input}$ (after dither injection) $2^\beta$, while the feedback multiplier 28 multiplies the noise shaping output nsh$_{out}$ by $2^\beta$. Here, the data loss function 27 may be a round, floor, or ceiling function, for example. Note that it is possible in a digital implementation of the quantizer 24' for the adjustable factor γ to instead be implemented as a ratio of two integers or as a floating point value, depending upon hardware.

Figure 10:
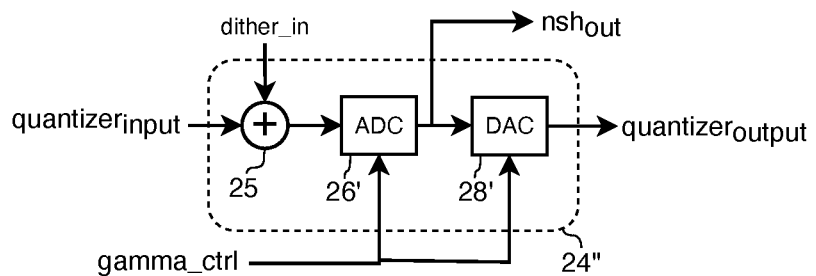
FIG. 10 is a block diagram showing an embodiment of the quantizer of FIG. 5 in which the quantizer is analog.

A sample generic analog quantizer 24'' is shown in FIG. 10. The analog quantizer 24'' includes a summer 25 through which an analog dither signal dither_in is injected into the analog quantizer input signal quantizer$_{input}$ prior to analog to digital conversion by an analog to digital converter (ADC) 26'. During the analog to digital conversion, an effective division of the quantizer input signal quantizer$_{input}$ by the adjustable factor γ is performed. The output of the ADC 26' is the noise shaping output nsh$_{out}$. A digital to analog converter (DAC) 28' converts the noise shaping output nsh$_{out}$ back to analog form, and performs an effective multiplication of the noise shaping output nsh$_{out}$ by the adjustable factor γ to produce an analog quantizer output signal quantizer$_{output}$.

Figure 11:
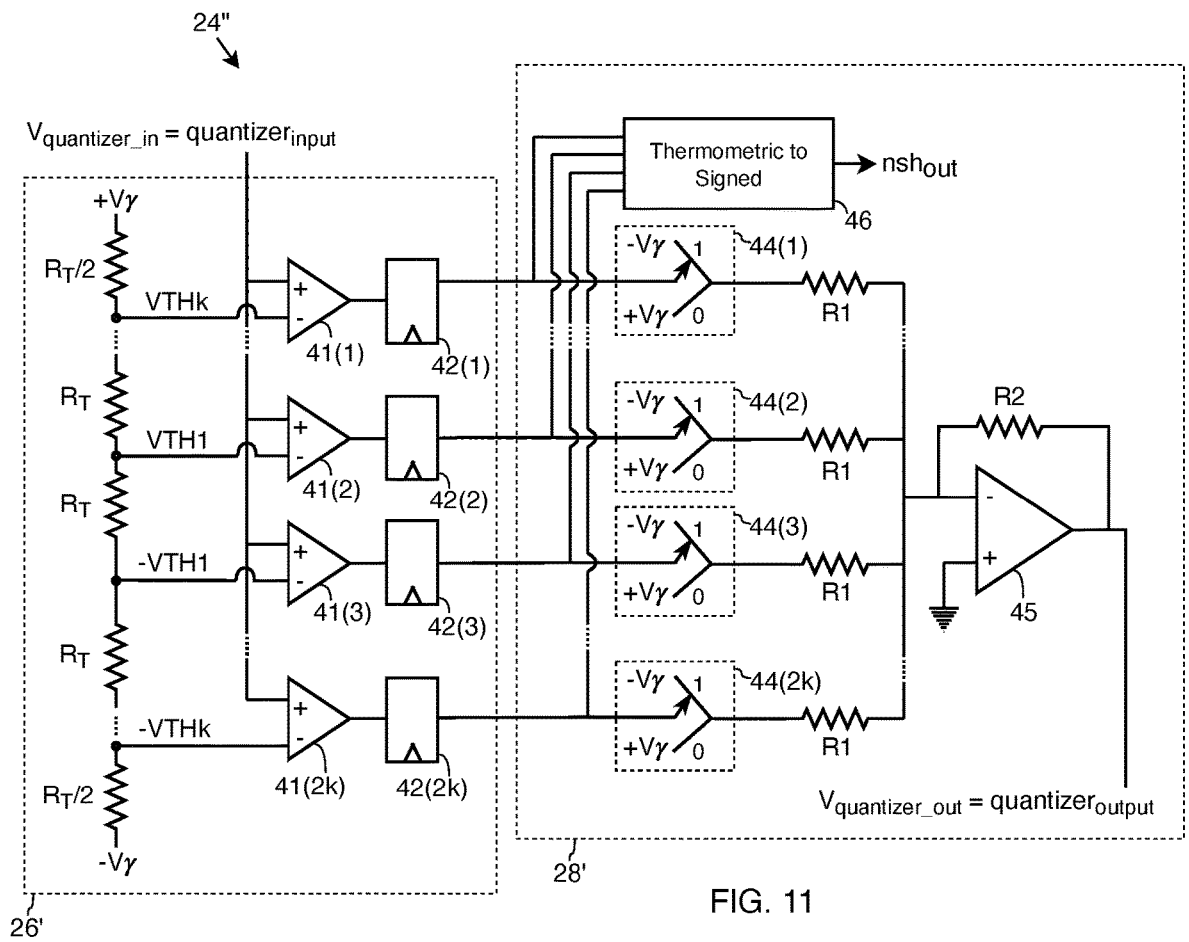
FIG. 11 is a schematic block diagram showing specifics of the ADC and DAC of the analog quantizer of FIG. 10 for use with a digital receiver section.

One potential implementation of the analog quantizer 24'' which is intended for use with a digital receiver section 35 is shown in FIG. 11. In this implementation, the ADC 26' is arranged to be used to generate k thresholds for use in analog to digital conversion. To that end, a resistor ladder is connected between a positive voltage $+V_\gamma$ and a negative voltage $-V_\gamma$, with these voltages having equal and opposite magnitudes set as a function of the current value of the adjustable factor γ. The voltage ladder is formed by m resistors (m being equal to 2k+1) connected in series between $+V_\gamma$ and $-V_\gamma$, and generates k positive threshold voltages and k negative threshold voltages. The magnitudes of the threshold voltages can be represented as:

$$V_{th_i} = \frac{2i-1}{m-1} \cdot V_\gamma, \text{ where } i = 1, \ldots, \frac{m-1}{2}$$

As illustrated, threshold voltages VTH1, ..., VTHk and −VTH1, ..., −VTHk are generated at taps between the resistors of the voltage ladder. The resistor directly connected to $+V_\gamma$ has a resistance of $R_T/2$, as does the resistor directly connected to $-V_\gamma$. The remainder of the resistors each have a resistance of $R_T$.

The ADC 26' in this analog quantizer 24" shown in FIG. 11 includes 2k comparators, here shown as comparators 41(1), ..., 41(2k), providing output to 2k flip flops, here shown as flip flops 42(1), ..., 42(2k). The flip flops 42(1), ..., 42(2k) provide their outputs as selection signals to 2k switch circuits, here shown as switch circuits 44(1), ..., 44(2k).

The comparators 41(1), ..., 41(2k) each have a non-inverting input terminal coupled to receive the quantizer input signal quantizer$_{input}$, which is an analog voltage $V_{quantizer\_in}$ in this instance. The comparators 41(1), ..., 41(2k) have respective inverting input terminals connected to different ones of the threshold voltages VTH1, ..., VTHk and −VTH1, ..., −VTHk. In the illustrated example, comparator 41(1) has its inverting input terminal connected to the threshold voltage VTHk, comparator 41(2) has its inverting input terminal connected to the threshold voltage VTH1, comparator 41(3) has its inverting input terminal connected to the threshold voltage −VTH1, and comparator 41(2k) has its inverting input terminal connected to the threshold voltage −VTHk. The flip flop 42(1) has its input receiving the output of the comparator 41(1) and has its output connected to provide a selection signal to the switch circuit 44(1), the flip flop 42(2) has its input receiving the output of the comparator 41(2) and has its output connected to provide a selection signal to the switch circuit 44(2), flip flop 42(3) has its input receiving the output of the comparator 41(3) and has its output connected to provide a selection signal to the switch circuit 44(3), and flip flop 42(2k) has its input receiving the output of the comparator 41(2k) and has its output connected to provide a selection signal to the switch circuit 44(2k).

Each switch circuit 44(1), ..., 44(2k) operates to selectively connect an associated resistor (each such resistor having a resistance of R1) between either $+V_\gamma$ or $-V_\gamma$ and an inverting input terminal of an amplifier 45, under control of the output of a respective flip flop 42(1), ..., 42(2k). When the output of a respective flip flop 42(1), ..., 42(2k) is asserted, the associated switch circuit 44(1), ..., 44(2k) connects its respective resistor to $-V_\gamma$ and otherwise connects its respective resistor to $V_\gamma$.

The amplifier 45 has its non-inverting input terminal grounded, and a resistor R2 is connected between the inverting input terminal and output of the amplifier 45. The output of the amplifier 45 is the quantizer output quantizer$_{output}$, which is an analog voltage $V_{quantizer\_out}$ in this instance.

The relationship in resistance value between R1 and R2 is as follows:

$$R1 = (m-1) \cdot R2$$

The output of each flip flop 42(1), ..., 42(2k) is also connected to circuit 46 (illustratively a thermometric to signed converter 46 that generates the noise shaping output nsh$_{out}$ in digital form therefrom).

As stated, the voltages $+V_\gamma$ and $-V_\gamma$ are based upon the adjustable factory. For example, the voltages $+V_\gamma$ and $-V_\gamma$ may be generated by a programmable voltage generator, with $V_\gamma$ depending on the adjustable factor γ (e.g., where the adjustable factor γ changes from γ1 to γ2, $V_\gamma$ changes from $V_{\gamma 1}$ to $V_{\gamma 2}$).

As another example, the ADC 26' and DAC 28' may be integrated within a noise shaper utilizing either an error feedback or sigma-delta modulator arrangement.

Figure 12A:
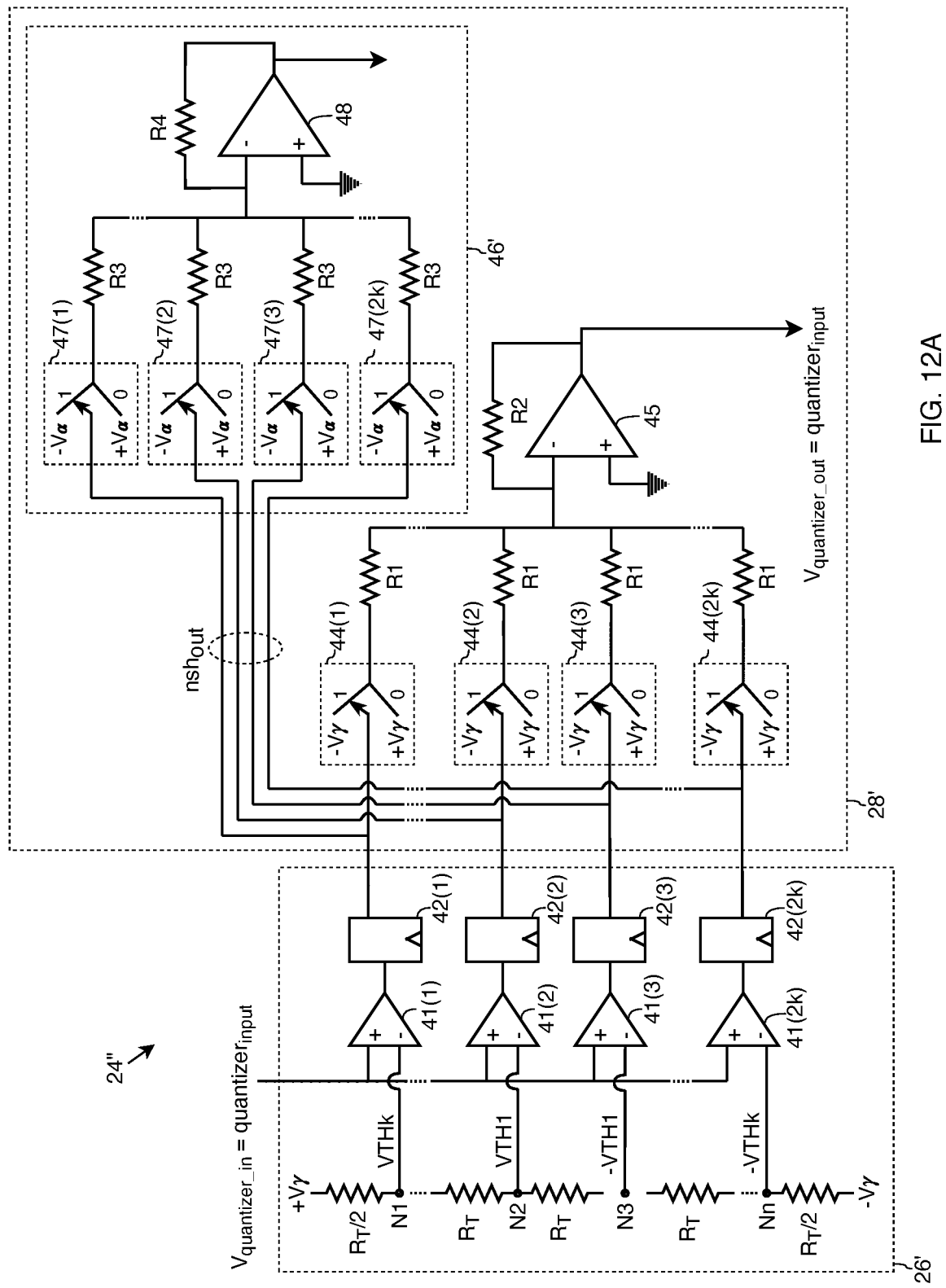
FIG. 12A is a schematic block diagram showing first possible specifics of the ADC and DAC of the analog quantizer of FIG. 10 for use with an analog receiver section.

A first potential implementation of the analog quantizer 24" which is intended for use with an analog receiver section 35 is shown in FIG. 12A. The difference in this analog quantizer 24" over that shown in FIG. 11 is that the converter 46' in this instance includes 2k switch circuits 47(1), ..., 47(2k) respectively connected to receive the outputs of flip flops 42(1), ..., 42(2k) as respective selection signals. The output of the flip flops 42(1), ..., 42(2k) here forms the noise shaping output nsh$_{out}$.

Each switch circuit 47(1), ..., 47(2k) operates to selectively connect an associated resistor (each such resistor having a resistance of R3) between either $+V_\alpha$ or $-V_\alpha$ and a non-inverting input terminal of an amplifier 48, under control of the output of a respective flip flop 42(1), ..., 42(2k). When the output of a respective flip flop 42(1), ..., 42(2k) is asserted, the associated switch circuit 47(1), ..., 47(2k) connects its respective resistor to $-V_\alpha$ and otherwise connects its respective resistor to $V_\alpha$.

The voltages $+V_\alpha$ and $-V_\alpha$ are based upon the adjustable factor α. For example, the voltages $+V_\alpha$ and $-V_\alpha$ may be generated by a programmable voltage generator, with $V_\alpha$ depending on the adjustable factor α (e.g., where the adjustable factor α changes from α1 to α2, $V_\alpha$ changes from $V_{\alpha 1}$ to $V_{\alpha 2}$).

The amplifier 48 has its non-inverting input terminal grounded, and a resistor R4 is connected between the inverting input terminal and output of the amplifier 48. The output of the amplifier 48 may be used for desired purposes.

The relationship in resistance value between R3 and R4 is as follows:

$$R3 = (m-1) \cdot R4$$

Figure 12B:
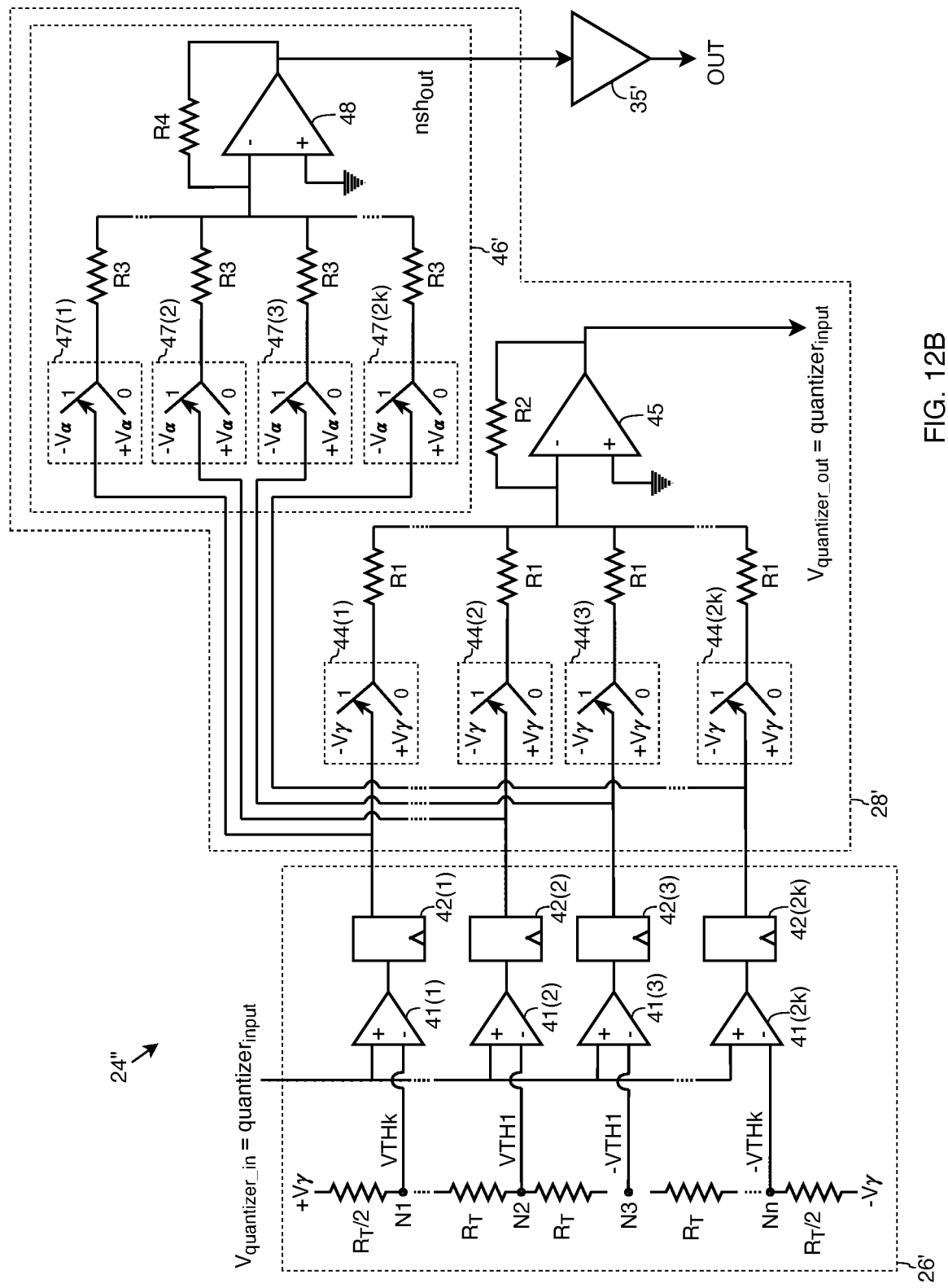
FIG. 12B is a schematic block diagram showing second possible specifics of the ADC and DAC of the analog quantizer of FIG. 10 for use with an analog receiver section.

A second potential implementation of the analog quantizer 24" is shown in FIG. 12B. The difference here is that the noise shaping output nsh$_{out}$ is produced at the output of the amplifier 48 as an analog voltage to be fed to the receiver 35', and here the receiver 35' is not scaled by the adjustable factor α because that scaling is performed by the converter 46'.

D. Digital Transmitter Section, Analog Receiver Section

Figure 13:
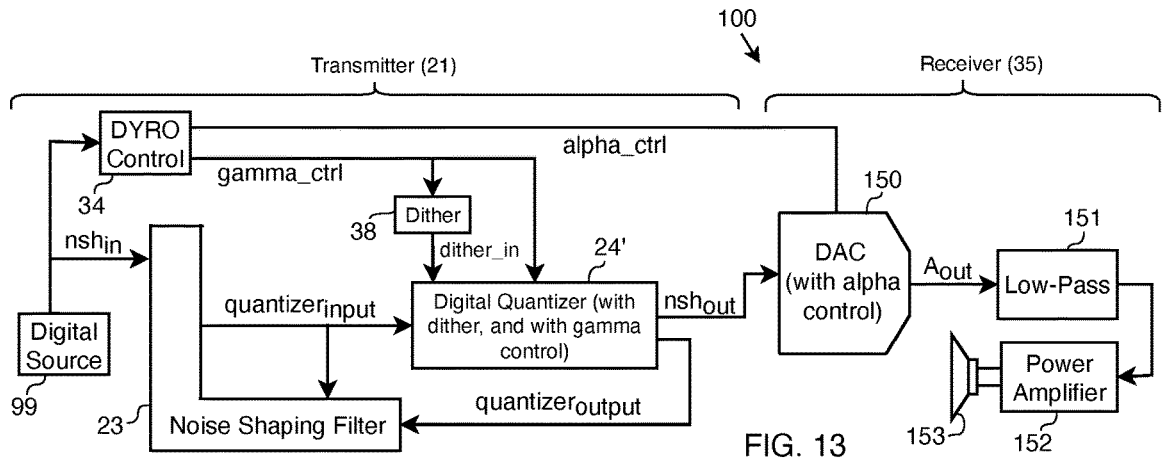
FIG. 13 is a block diagram showing an embodiment of noise shaping variable quantizer described herein where the quantizer is digital and the receiver section is analog.

A signal processing chain 100 is shown in FIG. 13 which includes a noise shaping digital quantizer as a digital transmitter section 22 and an analog receiver section 35. The noise shaping digital quantizer λ2 operates as described above with reference to FIGS. 4, 5, and 9 and needs no further description herein.

The analog receiver section 35 includes a current steering DAC 150 that converts the noise shaping output signal $nsh_{out}$ to produce an analog output signal $A_{out}$. The current steering DAC 150 includes a thermometric code conversion circuit that selects elementary contributions to the analog output signal $A_{out}$ that are scaled by the adjustable factor α. A low pass filter 151 filters quantization noise from the analog output signal $A_{out}$, and the analog output signal $A_{out}$ is then amplified by a power amplifier 152 that drives a speaker 153 or other output device.

Figure 14:
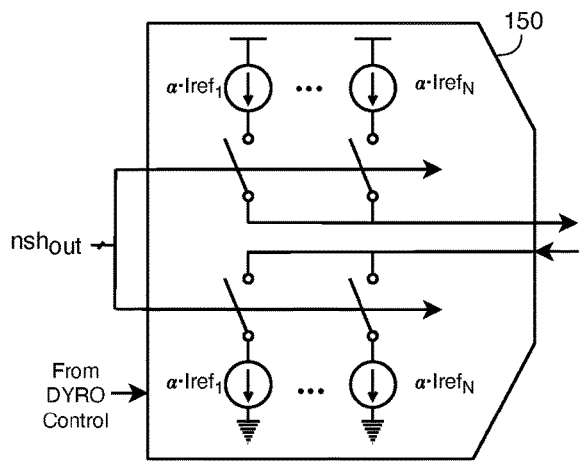
FIG. 14 is a schematic block diagram of the current steering DAC of FIG. 13.

An example implementation of the current steering DAC 150 is now described with additional reference to FIG. 14. The DAC 150 may be any suitable type of DAC, however, as an example, the illustrated DAC 150 is a current steering DAC that receives the noise shaping output signal $nsh_{out}$ as input.

The DAC 150 provides differential current outputs generated by $N=2^n$ respective current sources and current sinks that are selectively connected to the input by switches based upon the noise shaping output signal $nsh_{out}$, with n being, for example, 6 such that $2^n=64$. The current sources and current sinks each respectively source or sink a current Iref having a same magnitude multiplied by α. Stated differently, these currents are equal and each changed in magnitude proportionally to the current reference.

For example, where n=6, and therefore, $N=2^6=64$, there are 64 current sources and 64 current sinks in the DAC 150. The current sources are labeled in FIG. 14 as sourcing currents α·Iref$_1$, . . . , α·Iref$_N$ and the current sinks are labeled in FIG. 14 as sinking currents α·Iref$_1$, . . . , α·Iref$_N$.

E. Digital Transmitter Section, Digital Receiver Section

Figure 15:
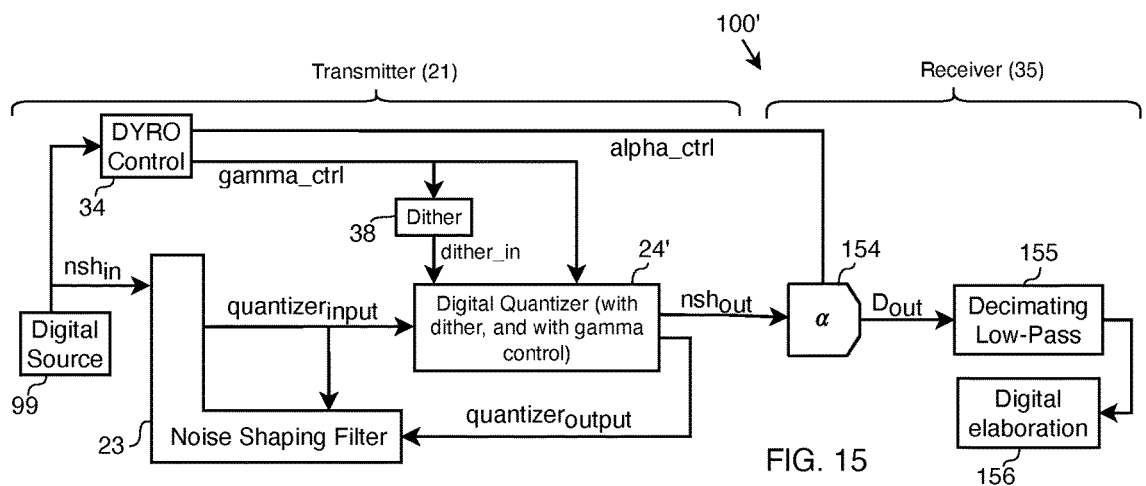
FIG. 15 is a block diagram showing an embodiment of a noise shaping variable quantizer described herein where the quantizer is digital and the receiver section is digital as well.

A signal processing chain 100' is shown in FIG. 15 which includes a noise shaping digital quantizer 24' as a digital transmitter section 22 and a digital receiver section 35. The noise shaping digital quantizer λ2 operates as described above with reference to FIGS. 4, 5, and 9 and needs no further description herein.

The digital receiver section 35 includes a scaling circuit 154 that scales the noise shaping output signal $nsh_{out}$ by α to produce a digital output signal $D_{out}$. The digital output signal $D_{out}$ is thereafter passed through a decimating low-pass filter 155 and then a digital elaboration circuit 156.

F. Analog Transmitter Section, Digital Receiver Section

Figure 16:
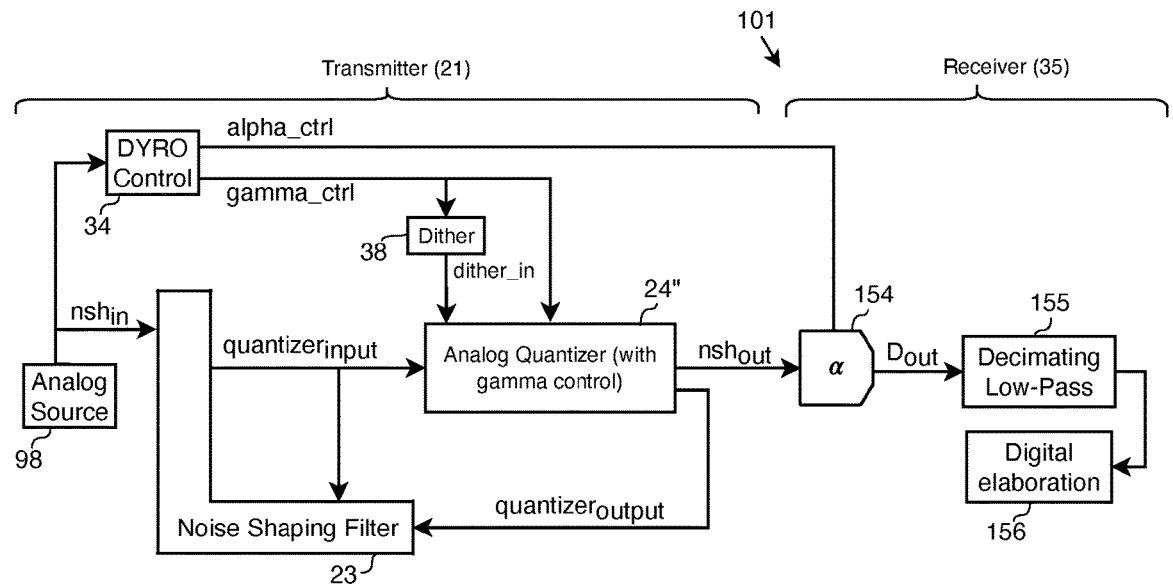
FIG. 16 is a block diagram showing an embodiment of a noise shaping variable quantizer described herein where the quantizer is analog and the receiver section is digital.

A signal processing chain 101 is shown in FIG. 16 which includes an analog quantizer 24" as an analog transmitter section 22 and a digital receiver section 35. The analog quantizer 24" operates as described above with reference to FIGS. 10, 11, 12 and needs no further description herein.

The digital receiver section 35 includes a scaling circuit 154 that multiplies the noise shaping output signal $nsh_{out}$ by α (with α≥1 or α<1) to produce a digital output signal $D_{out}$. The digital output signal $D_{out}$ is thereafter passed through a decimating low-pass filter 155 and then a digital elaboration circuit 156.

G. Analog Transmitter Section, Analog Receiver Section

Figure 17:
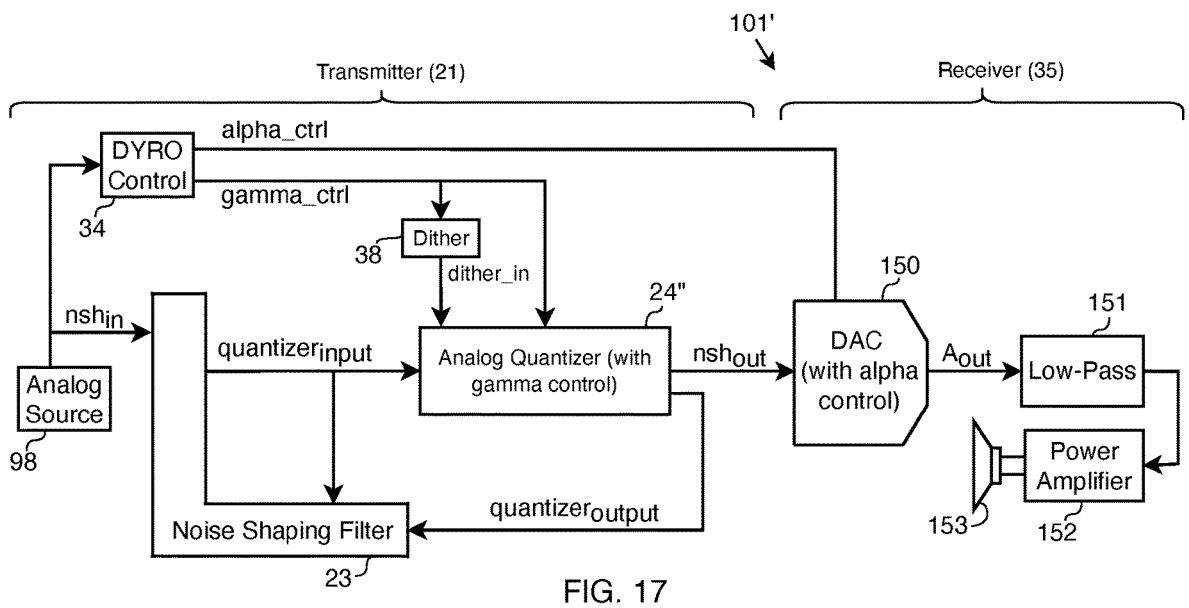
FIG. 17 is a block diagram showing an embodiment of a noise shaping variable quantizer described herein where the quantizer and the receiver section are both analog.

A signal processing chain 101' is shown in FIG. 17 which includes an analog quantizer 24" as an analog transmitter section 22 and an analog receiver section 35. The analog quantizer 24" operates as described above with reference to FIGS. 10, 12 and needs no further description herein.

The analog transmitter section 22 operates as described above with reference to FIG. 12 and needs no further description herein.

H. Noise Shaping Filter Specifics

The noise shaping filter 23 used in the above-described embodiments may utilize error feedback or sigma-delta modulation.

Figure 18:
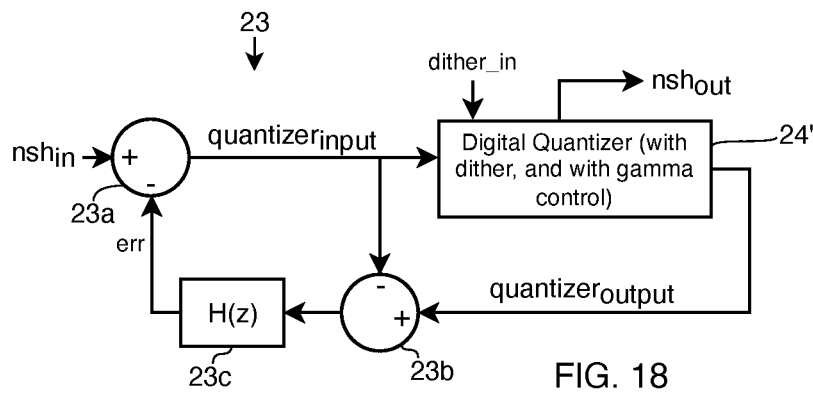
FIG. 18 is a block diagram showing the noise shaping filter of a digital quantizer described herein, the noise shaping filter utilizing error feedback.

Now described with reference to FIG. 18 is an embodiment of the noise shaping filter 23 utilizing error feedback and designed to work with a digital quantizer 24'. The noise shaping filter 23 includes an input summer 23a that subtracts an error signal err output by a noise shaping filter 23c from the noise shaping input signal $nsh_{in}$ to produce the quantizer input quantizer$_{input}$. The digital quantizer 24' injects the dither signal dither_in to the quantizer input quantizer$_{input}$ and divides the quantizer input quantizer$_{input}$ by the adjustable factor γ (which in this instance may be $½^\beta$), with that result being truncated such as by a rounding, floor, or ceiling function to produce the noise shaping output signal $nsh_{out}$. The digital quantizer 24' multiplies the noise shaping output signal $nsh_{out}$ to produce the quantizer output quantizer$_{output}$. An error summer 23b subtracts the quantizer input quantizer$_{input}$ from the quantizer output quantizer$_{output}$ and provides the result to the noise shaping filter 23c which has a transfer function of H(z). The noise shaping filter 23c produces the error signal err as output.

Figure 19:
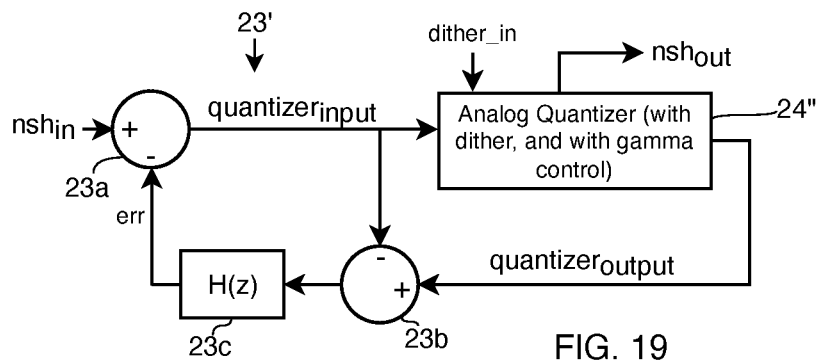
FIG. 19 is a block diagram showing the noise shaping filter of an analog quantizer described herein, the noise shaping filter utilizing error feedback.

The above-described error feedback arrangement may also be used with an analog quantizer 24", as shown in FIG. 19, and operating as described above with reference to FIG. 18.

Figure 20:
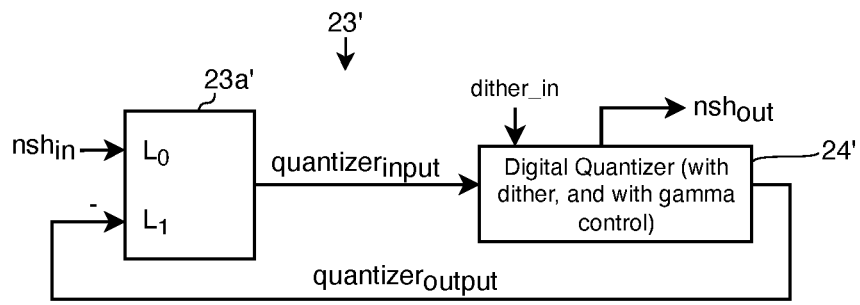
FIG. 20 is a block diagram showing the noise shaping filter of a digital quantizer described herein, the noise shaping filter utilizing sigma delta modulation.
Figure 21:
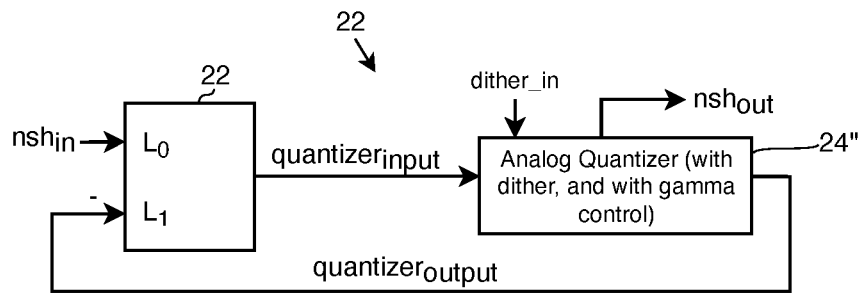
FIG. 21 is a block diagram showing the noise shaping filter of an analog quantizer described herein, the noise shaping filter utilizing sigma delta modulation.

Now described with reference to FIG. 20 is an embodiment of the noise shaping filter 23' in which the noise shaping filter is implemented as a sigma-delta modulator 23a', and designed to work with a digital quantizer 24'. The sigma-delta modulator 23a' includes a U-input ($L_0$) that receives the noise shaping input $nsh_{in}$ and a V-input ($L_1$) that receives the quantizer output quantizer$_{output}$ and the output of the sigma-delta modulator 23a' is the quantizer input quantizer$_{input}$. The sigma-delta modulator 23a' applies a two-input, one output filtering according to the equation $Y(z)=L_0(z)U(z)-L_1(z)V(z)$. The quantizer input quantizer$_{input}$ may be produced as a digital signal for use with the digital quantizer 24' (FIG. 20), or may be produced as an analog signal for use with the analog quantizer 24" (FIG. 21).

Sample sigma-delta modulator designs such as may be used in the embodiment of FIG. 20 may be found in Understanding Delta-Sigma Delta Data Converters, Pavan, Shanthi; Schreir, Richard; Temes, Gabor C., IEEE Press Series on Microelectronic Systems, IEEE 2017, the contents of which are incorporated by reference.

Figure 22:
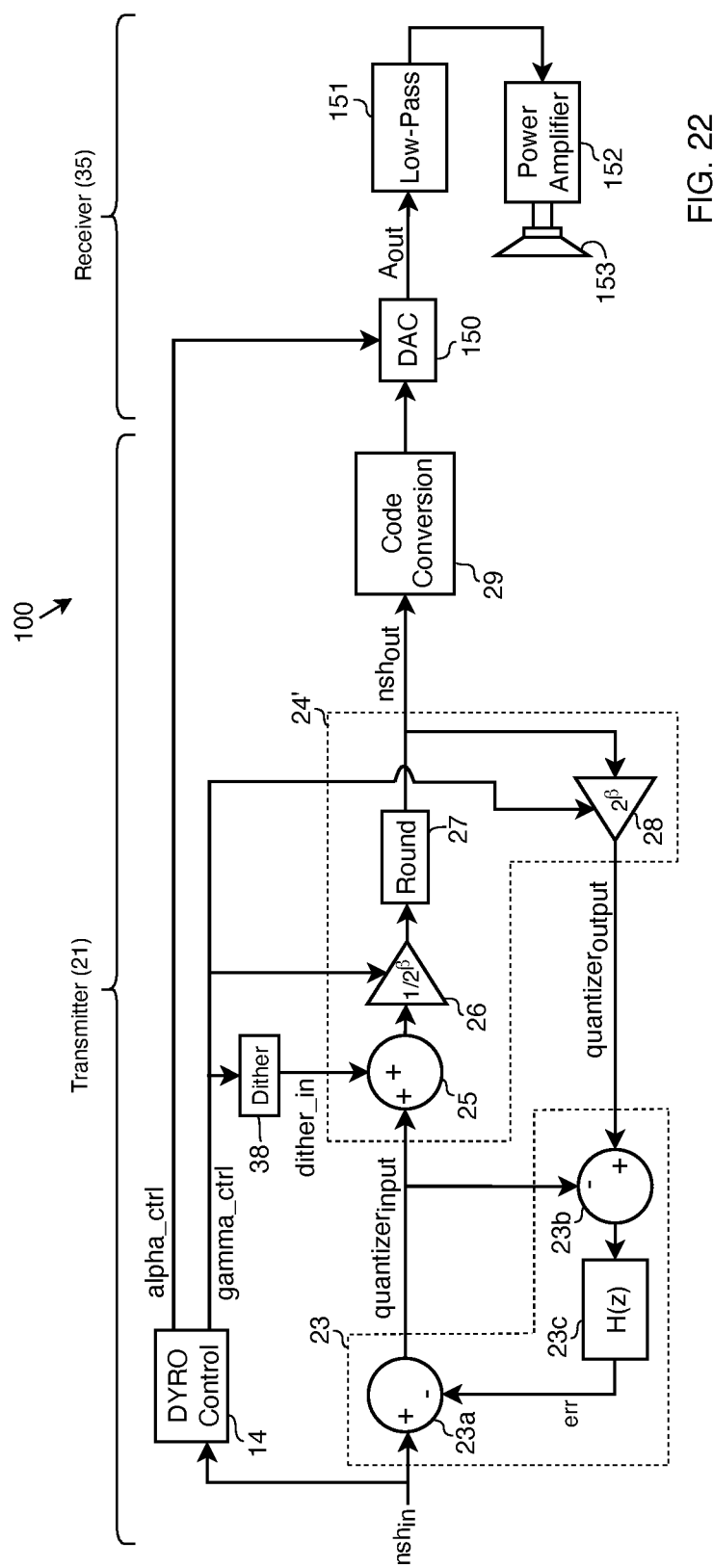
FIG. 22 is a schematic block diagram of a digital audio playback circuit described herein utilizing a digital noise shaping variable quantizer with error based feedback.

I. Audio Output Circuit with Digital Transmitter Section, Analog Receiver Section Now described with reference to FIG. 22 is a signal processing chain 100 utilized as an audio output circuit. In this signal processing chain 100, the transmitter section 21 includes a digital quantizer 24' and error feedback based noise shaping circuit 23 as described above, and the receiver section includes a current steering DAC 150 as described above During operation, the DYRO control circuit 14 compares the values of the noise shaping input $nsh_{in}$ to a series of thresholds, and based thereupon, adjusts the adjustable factor $\gamma$ and the adjustable factor $\alpha$ on the fly, with such adjusting maintaining the ratio $\alpha/\gamma$ as being a fixed constant. $\gamma$ and $\alpha$ may each take one of i different values, and in this embodiment, $\gamma=2^\beta$.

The thresholds for this example will now be discussed. Assume here that the noise shaping filter 23c is a finite impulse response filter with coefficients $fircoeff_k$. The relationship between the maximum noise shaping input $nsh_{in_{max}}$ and the maximum noise shaping output $nsh_{out_{max}}$ can be mathematically represented as:

$$\frac{nsh_{in_{max}} + \left(\Sigma_{k=1}^{NumCoeffs} |fircoeff_k|\right) \cdot \left(\frac{1}{2}2^{\beta_i} + \text{dither\_max}_i\right) + \text{dither\_max}_i}{2^{\beta_i}} = nsh_{out_{max}}$$

An expression $factor_i$ may be written as:

$$factor_i = \left(\sum_{k=1}^{NumCoeffs} |fircoeff_k|\right) \cdot \left(\frac{1}{2}2^{\beta_i} + \text{dither\_max}_i\right) + \text{dither\_max}_i$$

Therefore, $nsh_{in_{max}}(i)$ can be written as:

$$nsh_{in_{max}}(i=(2^{\beta_i} \cdot nsh_{out_{max}}) - factor_i$$

The thresholds can then be set as follows, assuming margin is used:

$$th(i) = nsh_{in_{max}}(i) \cdot margin(i) = [(2^{\beta_i} \cdot nsh_{out_{max}}) - factor_i] \cdot margin(i)$$

Figure 23:
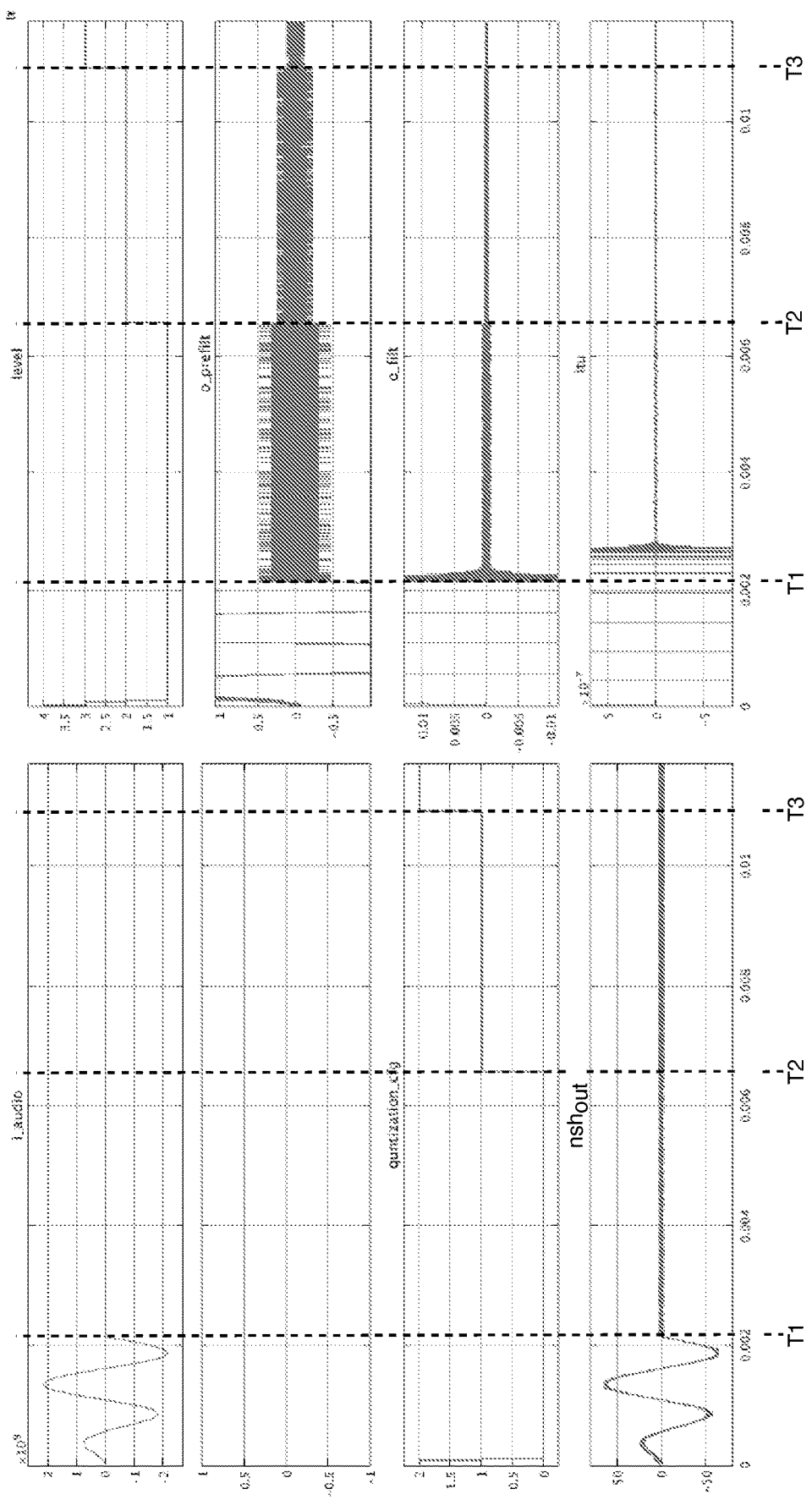
FIG. 23 includes a series of graphs showing values of signals in the digital audio playback circuit of FIG. 22 during operation.

Example operation is now described with additional reference to FIG. 23. Assume in this case that the noise shaping input signal $nsh_{in}$ is 24 bit, and the noise shaping output signal $nsh_{out}$ is 7 bit. Initially, assume the adjustable factor $\gamma$ to be set to:

$$\gamma = 2^\beta = 2^{17}$$

Assume the current reference $I_{ref}$ used by the DAC 15 is 1 µA. Prior to time T1, the input audio signal i_audio (which is interpolated to produce the noise shaping input $nsh_{out}$) is playing audio and not muted. At time T1, the input audio signal i_audio is muted, and the noise shaping at the output $nsh_{out}$ of the noise shaping circuit 23 can be observed between times T1 and T2. The quantization noise prior to filtering within the noise shaping circuit 23 can be observed between times T1 and T2 as o_prefilt, and after filtering can observed between times T1 and T2 as o_filt.

At time T2, $nsh_{in}$ is below the first threshold for the given period of time, and therefore the $\beta$ is reduced to 16 by the DYRO control circuit 14, so the adjustable factor $\gamma$ is set such that:

$$\gamma = 2^\beta = 2^{16}$$

Since $\beta$ is being reduced by one, the DYRO control circuit 14 adjusts the reference current $I_{ref}$ within the DAC 14 accordingly by properly scaling $\alpha$ (keeping in mind that $\alpha/\gamma$ remains as a fixed constant), which in this case yields a reduction in the reference current $\alpha \cdot I_{ref}$ from 1 µA to ½ µA. The reduction of the quantization noise prior to filtering within the noise shaping circuit 23 can be observed between times T2 and T3 as o_prefilt, and after filtering can observed between times T2 and T3 as o_filt.

At time T3, $nsh_{in}$ is below the second threshold (which is lower than the first threshold), and therefore $\beta$ is reduced to 15 by the DYRO control circuit 14. Since the adjustable factor $\beta$ is being reduced by one, the DYRO control circuit 14 adjusts the reference current $\alpha \cdot I_{ref}$ within the DAC 14 accordingly, which in this case is a reduction from ½ µA to ¼ µA. The further reduction of the quantization noise prior to filtering within the noise shaping circuit 23 can be observed after time T3 as o_prefilt, and after filtering can observed after time T3 as o_filt.

Observe that at the changing of the adjustable factor $\beta$ at times T2 and T3, there is no occurrence of a transient disturbance which would manifest as an audible "pop".

Although not expressly shown on in the graph of FIG. 23, note that the dither is adjusted according to the adjustable factor $\gamma$. For example, according to this specific embodiment where $\gamma=2^\beta$, the dither range may be from $[-2^\beta, 2^{62}]$, with a triangular probability distribution, and with $\beta$ being changed as the adjustable factor $\gamma$ is changed.

J. Audio Sampling Embodiment

The above dynamic range expansion performed through the use of variable scaling of re-quantization during digital to analog conversion is equally applicable to analog to digital conversion. To that end, an embodiment of an audio sampling circuit 200 using variable scaling of re-quantization during analog to digital conversion is now described with reference to FIG. 24.

The audio sampling circuit 200 includes a microphone 201 receiving input sound waves and converting them to an analog audio signal, which is then preconditioned by a preconditioning amplifier 202 to produce an analog audio input signal $A_{in}$. The preconditioning amplifier 202 may have a low-pass filtering behavior because the noise shaping input signal $nsh_{in}$ is within a limited bandwidth range. A noise shaping converter 203, here a sigma-delta based analog to digital converter controlled based upon the adjustable factor $\gamma$, receives the analog audio input signal $A_{in}$ and digitizes the analog audio input signal $A_{in}$ to produce the noise shaping input signal $nsh_{in}$, which is then compensated by a compensation circuit 204 according to the adjustable factor $\alpha$, and in turn decimated by a decimation filter 205 to produce output that may be used for suitable purposes, for example by a digital elaboration unit for further processing, for example in a wave file writing system. The DYRO control circuit 206 operates as described above, comparing the analog input signal $A_{in}$ to the thresholds and adjusting the adjustable factors $\gamma$ and $\alpha$ accordingly.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A signal processing circuit, comprising:
 a transmitter section including a noise shaper, the noise shaper comprising:
  a filter receiving a noise shaping input signal and a quantizer output signal, the filter configured to generate a quantizer input signal based at least upon the noise shaping input signal and the quantizer output signal; and a quantizer receiving the quantizer input signal and configured to divide the quantizer input signal by a first scaling factor to produce a noise shaping output signal, and to multiply the noise shaping output signal by the first scaling factor to produce the quantizer output signal;

a receiver section including:

receiver circuitry receiving the noise shaping output signal, the receiver circuitry configured to scale the quantizer output signal by a second scaling factor; and a dynamic range optimization circuit configured to:

determine whether an absolute value of the noise shaping input signal is less than a threshold value;

lower the first scaling factor in response to the absolute value of the noise shaping input signal being less than the threshold value; and decrease the second scaling factor in response to the absolute value of the noise shaping input signal being less than the threshold value, proportionally to the lowering of the first scaling factor, such that a ratio between the first scaling factor and the second scaling factor remains substantially constant.

2. The signal processing circuit of claim 1, wherein the noise shaping input signal represents audio data; and wherein the receiver section comprises:

a current steering digital to analog converter (DAC) configured to generate an analog output signal from the noise shaping output signal by selectively connecting or disconnecting current sources and current sinks to differential outputs in response to the noise shaping output signal, the current sources and current sinks being scaled by the second scaling factor;

a power amplifier configured to amplify the analog output signal; and a speaker driven by the analog output signal;

wherein adjustment of the first scaling factor and the second scaling factor by the dynamic range optimization circuit proportionally to one another serves to prevent transients resulting from scaling factor adjustment from being present in the noise shaping output signal and therefore from causing audible pops to be played by the speaker.

3. The signal processing circuit of claim 1, wherein the dynamic range optimization circuit is further configured to increase the first scaling factor in response to the absolute value of the noise shaping input signal being greater than the threshold value and increase the second scaling factor in response to the absolute value of the noise shaping input signal being greater than the threshold value, proportionally to the increase in the first scaling factor, such that the ratio between the first scaling factor and second scaling factor remains substantially constant.

4. The signal processing circuit of claim 1, further comprising a dither generator configured to generate a dither signal having a range defined by the first scaling factor; and wherein the transmitter section includes a summing circuit configured to inject the dither signal into the quantizer input signal prior to quantization thereof by the quantizer.

5. The signal processing circuit of claim 1, wherein the quantizer applies a truncation to the quantizer input signal after division thereof by the first scaling factor.

6. The signal processing circuit of claim 1, wherein the first scaling factor is a power of two.

7. The signal processing circuit of claim 1, wherein the quantizer input signal and quantizer output signal are digital; and wherein the quantizer is implemented digitally.

8. The signal processing circuit of claim 1, wherein the quantizer input signal and quantizer output signal are analog; and wherein the quantizer is implemented in an analog fashion, with the quantizer comprising:

an analog to digital converter (ADC) receiving the quantizer input signal and digitizing the quantizer input signal to produce the noise shaping output signal such that it is scaled by the first scaling factor; and a digital to analog converter (DAC) receiving the noise shaping output signal and converting the noise shaping output signal to produce the quantizer output signal such that it is multiplied by the first scaling factor.

9. The signal processing circuit of claim 1, wherein the receiver section is implemented digitally.

10. The signal processing circuit of claim 1, wherein the receiver section is implemented in an analog fashion.

11. The signal processing circuit of claim 1, wherein the filter comprises:

an input summer configured to subtract an error signal from the noise shaping input signal to produce the quantizer input signal;

an error summer configured to subtract the quantizer input signal from the quantizer output signal to produce an intermediate output; and a noise shaping filter configured to apply a noise shaping filter function to the intermediate output to produce the error signal.

12. The signal processing circuit of claim 1, wherein the filter comprises: a sigma delta modulator receiving the noise shaping input signal and the quantizer output signal as output and applying a two-input one-output filtering thereto to produce the quantizer input signal.

13. The signal processing circuit of claim 12, wherein the two-input one-output filtering has a transfer function of:

$$Y(z)=L\_0(z)U(z)-L\_1(z)V(z),$$

with the noise shaping input signal being $U(z)$ and the quantizer output signal being $V(z)$.

14. The signal processing circuit of claim 1, wherein the absolute value of the noise shaping input signal is determined from a current value of the noise shaping input signal.

15. A signal processing method, comprising:

generating a quantizer input signal based at least upon a noise shaping input signal and a quantizer output signal;

dividing the quantizer input signal by a first scaling factor to produce a noise shaping output signal, and multiplying the noise shaping output signal by the first scaling factor to produce the quantizer output signal;

scaling the quantizer output signal by a second scaling factor;

determining whether an absolute value of the noise shaping input signal is less than a threshold value;

lowering the first scaling factor in response to the absolute value of the noise shaping input signal being less than the threshold value; and decreasing the second scaling factor in response to the absolute value of the noise shaping input signal being less than the threshold value, proportionally to the lowering of the first scaling factor such that a ratio between the first scaling factor and the second scaling factor remains substantially constant.

16. The signal processing method of claim 15, further comprising:
generating an analog output signal from the noise shaping output signal by selectively connecting or disconnecting current sources and current sinks to differential outputs in response to the noise shaping output signal, the current sources and current sinks being scaled by the second scaling factor;
amplifying the analog output signal; and
driving a speaker with the analog output signal;
wherein adjustment of the first scaling factor and the second scaling factor proportionally to one another serves to prevent transients resulting from scaling factor adjustment from being present in the noise shaping output signal and therefore from causing audible pops to be played by the speaker.

17. The signal processing method of claim 15, further comprising:
increasing the first scaling factor in response to the absolute value being greater than the threshold value and increasing the second scaling factor in response to the absolute value being greater than the threshold value, proportionally to the increase in the first scaling factor, such that the ratio between the first scaling factor and second scaling factor remains substantially constant.

18. The signal processing method of claim 15, further comprising generating a dither signal having a range defined by the first scaling factor; and injecting the dither signal into the quantizer input signal prior to quantization thereof.

19. The signal processing method of claim 15, further comprising applying a truncation to the quantizer input signal after division thereof by the first scaling factor.

20. The signal processing method of claim 15, wherein the first scaling factor is a power of two.

* * * * *